United States Patent [19]

Soejima

[11] Patent Number: 4,957,874
[45] Date of Patent: Sep. 18, 1990

[54] SELF-ALIGNED BI-CMOS DEVICE HAVING HIGH OPERATION SPEED AND HIGH INTEGRATION DENSITY

[75] Inventor: Katsumoto Soejima, Tokyo, Japan

[73] Assignee: NEC Corporation, Japan

[21] Appl. No.: 276,781

[22] Filed: Nov. 28, 1988

[30] Foreign Application Priority Data

Nov. 27, 1987 [JP] Japan .................. 62-298996

[51] Int. Cl.$^5$ .................. H01L 21/00; H01L 21/02; H01L 21/22; H01L 21/26
[52] U.S. Cl. .................. 437/31; 437/34; 437/56; 437/57; 148/DIG. 9; 357/34; 357/42; 357/43
[58] Field of Search .................. 437/31, 34, 56, 57, 437/154; 148/DIG. 9, DIG. 31, DIG. 38; 357/34, 42, 43, 48

[56] References Cited

U.S. PATENT DOCUMENTS

| 4,806,499 | 2/1989 | Shiohara .................. 437/31 |
| 4,825,275 | 4/1989 | Tomassetti .................. 357/43 |

FOREIGN PATENT DOCUMENTS

| 0139266 | 2/1985 | European Pat. Off. .................. 357/43 |
| 0236153 | 10/1986 | Japan .................. 357/43 |

OTHER PUBLICATIONS

Kobayashi, Y., Biplar CMOS–Merged Technology for High–Speed 1–Mbit DRAM, IEEE Transact. on Elect. Devices, vol. 36, No. 4, Apr. 1989, pp. 706–711.
IBM Tech. Dis. Bull., Bipolar Device Incorporated into CMOS Technology; vol. 28, No. 9, Feb. 1986, pp. 3813–3815.
O, K., BiCMOS Process Utilizing Selective Epitoxy for Analog/Digital Applications, IEEE Trans. on Elect. Devices, vol. 36, No. 7, Jul. 1989, pp. 1362–1369.

*Primary Examiner*—Brian E. Hearn
*Assistant Examiner*—B. Everhart
*Attorney, Agent, or Firm*—Laff, Whitesel, Conte & Saret

[57] ABSTRACT

A Bi-CMOS device comprises a first insulating layer formed on a principal surface of a semiconductor substrate to extend outwardly from an edge portion of a base region of a bipolar transistor and from an edge portion of each source/drain region of each MOS transistor. A first polycrystalline semiconductor layer is formed on and in contact with a surface area of the base region of the bipolar transistor and a surface area of each source/drain region of each MOS transistor so as to extend on the first insulating layer. A second insulating layer is formed to cover the first polycrystalline semiconductor layer, a base-emitter junction exposed at the principal surface of the substrate and a portion of each of the base region and the emitter region adjacent to the exposed base-emitter junction. The second insulating layer also covers an inside edge of each source/drain region of the MOS transistors, and portions of each source/drain region and a channel region adjacent to the inside edge. A second polycrystalline semiconductor layer is formed to cover a gate insulator of each MOS transistors and a portion of an emitter region of the bipolar transistor in contact with the emitter region, so as to extend on the second insulating layer.

2 Claims, 9 Drawing Sheets

NPN BIPOLAR TRANSISTOR 200

SELF-ALIGNED BI-CMOS DEVICE HAVING HIGH OPERATION SPEED AND HIGH INTEGRATION DENSITY

BACKGROUND OF THE INVENTION

1. Field of the invention

The present invention relates to a semiconductor device, and more specifically to a semiconductor device having fine complementary metal-oxide-semiconductor (CMOS) transistors and fine bipolar transistors which are fabricated in the same substrate. The semiconductor device is called "Bi-CMOS device" in the specification.

2. Description of related art

Lately, to realize a high access speed, a high integration density and a low power consumption in integrated circuits, Bi-CMOS devices are actively studied and reduced into practice which are composed of bipolar transistors which can realize a high access speed and CMOS transistors which can realize a high integration density and can operate with a low power consumption.

In conventional Bi-CMOS devices, however, the operation speed and the integration density have been limited mainly by the following three factors, namely, a gate electrode length of NMOS transistors and PMOS transistors, an emitter width of bipolar transistors, and a base resistance of the bipolar transistors. The base resistance of the bipolar transistors is substantially in proportion to a distance between an emitter diffused region and a so-called grafted base region for contact to a base electrode.

In the conventional Bi-CMOS devices, it has been difficult to reduce the gate electrode length to a value not greater than 1.0–1.3 $\Xi$m because of compatibility with reliability of devices and yield in manufacturing. For the same reason, it has been difficult to reduce the emitter width to a value not greater than 1.0–1.3 $\mu$m. In addition, the distance between the emitter diffused region and the grafted base region could not have been decreased to a value not greater than 2 or 3 $\mu$m, because of limitation in accuracy of alignment and in accuracy of etching.

In a prior manufacturing process for bipolar transistors, Japanese Patent Application Laid-open Nos. Sho 60-81862 and Sho 60-89969 have proposed to use a Super Self-aligned process Technology (SST) for forming a base portion and an emitter portion in a self-alignment manner. However, the method disclosed in these Japanese applications has been effective only in fabricating a fine bipolar transistor integrated circuit. A manufacturing process for Bi-CMOS devices has to be applied commonly to formation of bipolar devices and formation of MOS devices, so that the steps of manufacturing process are as less as possible.

SUMMARY OF THE INVENTION

Accordingly, it is an object of the present invention to provide an semicondcutor device which has overcome the above mentioned defect of the conventional Bi-CMOS devices.

Another obrject of the present invention is to provide a Bi-CMOS device which can have a high integration density and a high operation speed.

Still another object of the present invention is to provide a Bi-CMOS device composed of MOS transistors having a reduced gate electrode length and bipolar transistors having an reduced emitter width and a reduced base resistance.

A further object of the present invention is to provide a process for manufacturing the above mentioned Bi-CMOS device.

The above and other objects of the present invention are achieved in accordance with the present invention by a semiconductor device which includes at least one bipolar transistor, one N-channel MOS transistor and one P-channel transistor which are formed in the same semiconductor substrate at the same semiconductor layer level, the bipolar transistor includng a collector region formed in the semiconductor substrate, a base region formed in the collector region and an emitter region formed in the base region, each of the base region and the emitter region having a surface area positioned at a principal surface of the semiconductor substrate so that a base-emitter junction is exposed at the principal surface of the semiconductor substrate, and each of the N-channel transistor and the P-channel transistor including a source region and a drain region separated from each other, a channel region formed between the source region and the drain region, a gate insulator formed on the channel region and a gate electrode formed on the gate insulator, each of the source region and the drain region having a surface area positioned at the principal surface of the semiconductor substrate, comprising:

a first insulating layer formed on the principal surface of the semiconductor subsrate to extend outwardly from a peripheral portion of the surface area of the base region of the bipolar transistor and from a peripheral portion of the surface area of the source region and the drain region of each of the N-channel transistor and the P-channel transistor;

a first polycrystalline semiconductor layer formed on the first insulating layer and formed on and in contact with the surface area of the base region of the bipolar transistor and the surface area of the source region and the drain region of each of the N-channel transistor and the P-channel transistor;

a second insulating layer formed to cover the first polycrystalline semiconductor layer, the second insulating layer covering the base-emitter junction exposed at the principal surface of the semiconductor substrate and a portion of the surface area of each of the base region and the emitter region adjacent to the exposed base-emitter junction, the second insulating layer also covering an inside edge of the surface area of each of the source region and the drain region of the MOS transistors and portions of the surface area of each of the source region and the drain region and a surface of the channel region adjacent to the inside edge; and a second polycrystalline semiconductor layer formed to cover the second insulating layer and the gate insulator of each of the MOS transistors and also to cover a portion of the surface area of the emitter region of the bipolar transistor in contact with the portion of the surface area of the emitter region.

According to another aspect of the present invention, there is provided a process for manufacturing a semiconductor device which includes at least one bipolar transistor, one N-channel MOS transistor and one P-channel transistor which are formed in the same semiconductor substrate at the same semiconductor layer level, comprising:

preparing a substrate including a bipolar transistor section including a collector region formed in the semiconductor substrate, and a first conduction type well for a first type MOS transistor and a second conduction type well for a second type MOs transistor, the bipolar transistor section, the first conduction type well and the second conduction type well being isolated from each other and covered by a first insulating layer formed on the principal surface of the semiconductor substrate;

selectively etching the first insulating layer to expose a portion of the bipolar transistor section and forming a first polycrystalline semiconductor layer on the first insulating layer and the exposed portion of the bipolar transistor section;

selectively doping a first impurity to a portion of the first polycrystalline semiconductor layer on the exposed portion of the bipolar transistor section and on the first conduction type well, respectively, and also selectively doping a secnd impurity of a conduction type opposite to that of the first impurity, to another portion of the first polycrystalline semiconductor layer on the second conduction type well and on another portion of the bipolar transistor section, respectively;

selectively removing a portion of the first polycrystalline semiconductor layer on the first conduction type well, the second conduction type well and on the another portion of the bipolar transistor section so as to partially expose the first insulating layer;

forming a second insulatign layer on the first polycrystalline semiconductor layer and a portion of the first insulating layer respectively exposed in the first conduction type well, the second conduction type well and the bipolar transistor section;

over-etching the exposed portion of the first insulating layer by using the second insulating layer as a mask so that the first insulating layer under the first polycrystalline semiconductor layer is partially removed;

filling a polycrystalline semiconductor to a space formed under the first polycrystalline semiconductor layer as the result of the over-etching and then selectively removing the filled polycrystalline semiconductor so as to leave a portion of the filled polycrystalline semicondcutor under the first polycrystalline semiconductor layer;

heating the substrate so that the impurities included in the first polycrystalline semiconductor layer are respectively diffused to the first conduction type well, the second conduction type well and the bipolar transistor section;

selectively doping impurity to only a portion of the bipolar transistor section which is not covered by the first polycrystalline semiconductor layer so that a base region is formed;

forming an oxide layer on the first conduction type well, the second conduction type well and the bipolar transistor section which are not covered by the first polycrystalline semiconductor layer so that the oxide layer formed on the first conduction type well and the second conduction type well forms a gate insulator;

selectively removing only the oxide layer on the bipolar transistor section which is not covered by the first polycrystalline semiconductor layer so that an area within the base region where an emitter region is to be formed is exposed;

depositing a second polycrystalline semiconductor layer including a predetertmined conduction type of impurity, on the second insulating layer, the gate insulator on each of the first conduction type well and the second conduction type well, and the emitter formation area in the bipolar transistor section; and heating the substrate to cause the predetermined conduction type of impurity contained in the second polycrystalline semiconductor layer to be diffused to the emitter formation area in the bipolar transistor section so that an emitter region is formed in the bipolar transistor section.

The above and other objects, features and advantages of the present invention will be apparent from the following description of preferred embodiments of the invention with reference to the accompanying drawings.

DESCRIPTION OF THE PREFERRED EMBODIMENTS

Figure 1:
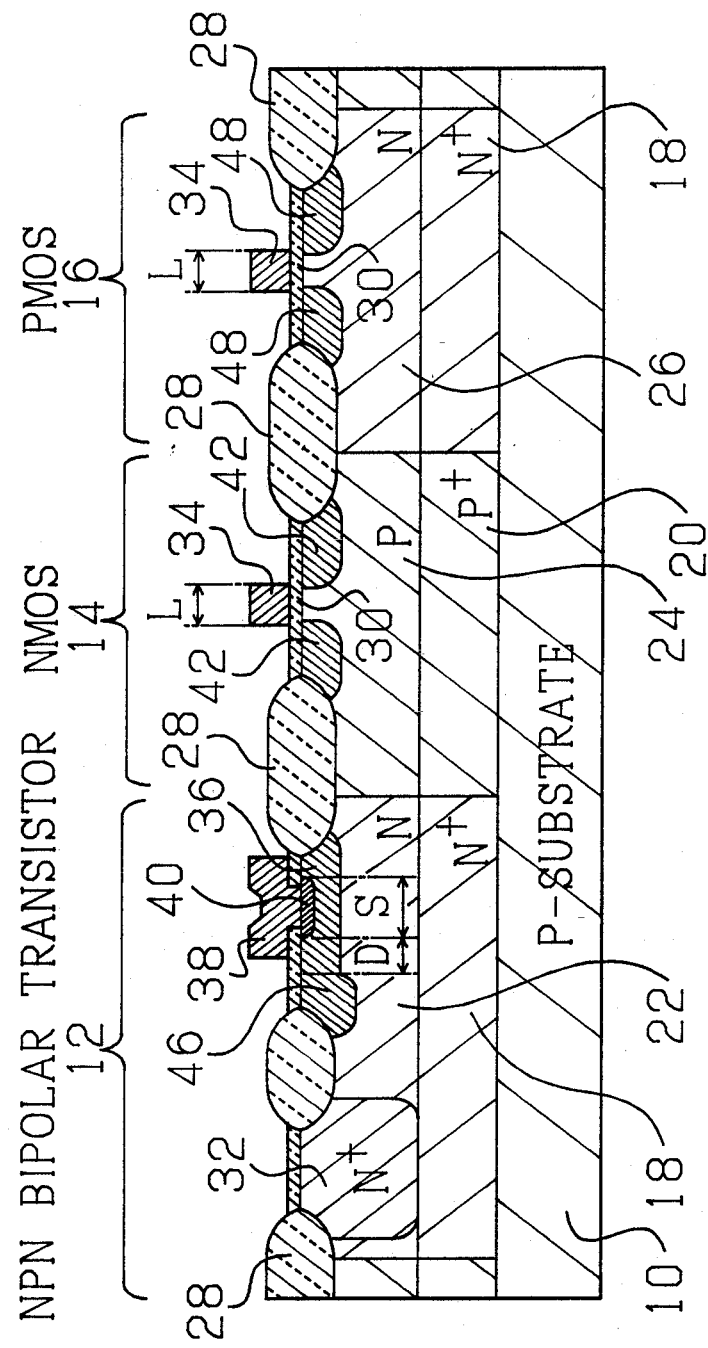
FIG. 1 is a diagrammatical sectional view of a conventional Bi-CMOS device.

Referring to FIG. 1, there is shown a diagrammatical sectional view of one typical conventional Bi-CMOS device. The shown Bi-CMOS device includes a P-type semiconductor substrate 10 having an NPN bipolar transistor 12, an NMOS transistor 14 and a PMOS transistor 16 formed thereon. The shown Bi-CMOS device can be formed as follows: First, an N+ buried layer 18 is formed at portions of the substrate where the NPN transistor 12 and the PMOS transistor 16 are to be formed, and an P+ buried layer 20 is formed at a portion of substrate where the NMOS transistor 14 is to be formmed. Then, an N-epitaxial layer 22 is formed on the N+ buried layer 18 for the NPN transistor 12. A P-type well 24 is formed on the P+ buried layer 20 for the NMOS transistor 14 and an N-type well 26 is formed on the N+ buried layer 18 for the PMOS transistor 16. A field oxide layer 28 having for example a thickness of 1 μm is formed at a boundary region between each pair of adjacent epitaxial layer and well or adjacent wells for device isolation.

For the MOS transistors, a gate insulator layer 30 is formed to cover a top surface of each of the wells. For the NPN transistor, on the other hand, a collector N+ diffused layer 32 is formed to extent downwardly from a top surface area of the epitaxial layer 22 where a contact for a collector should be formed, and to reach the N+ buried layer 18 for decrease of a collector resistance of the NPN transistor 12. Thereafter, N+ polysilicon layer 34 is formed on the gate insulator layer 30 and patterned to form a gate electrode of each of the MOS transistors 14 and 16. Further, a base layer 36 is formed in the epitaxial layer 22 of the bipolar transistor 12, and then, the silicon oxide layer on an area where an emitter region is to be formed is selectively removed. A second polysilicon layer 38 is formed thereon which is different from the first polysilicon layer 34 and patterned to form an emitter electrode. Thereafter, arsenic ions are implanted to the substrate through a suitable mask to simultaneously form an N+ emitter polysilicon layer 38, an N+ emitter diffused region 40, and N+ diffused regions 42 forming a source region and a drain region of the NMOS transistor 14, respectively. In addition, boron ions are implanted to the substrate through another suitable mask to simultaneously from a P+ grafted base diffused layer 46 of the bipolar transistor 12, and P+ diffused regions 48 forming a source region and a drain region of the PMOS transistor 16, respectively.

In the above mentioned conventional Bi-CMOS device, a gate length L of the NOMS transistor 14 and the PMOS transistor 16 could not have been reduced to a value not greater than 1.0–1.3 μm because of limitation required for reliability of devices and yield in manufacturing. Similarly, an emitter width S of the bipolar transistor 12 could have not decreased to a value not greater than 1.0–1.3 μm. In addition, a distance D between the emitter diffused region 40 and the grafted base region 46 could not have been reduced to a value not greater than 2 or 3 μm, because of limitation in accuracy of alignment and in accuracy of etching. This distance D will substantially determine a base resistance of the bipolar transisttor 12. For these factors, the conventional Bi-CMOS devices could have realized only a limited operation speed and a limited integration density.

Figure 2:
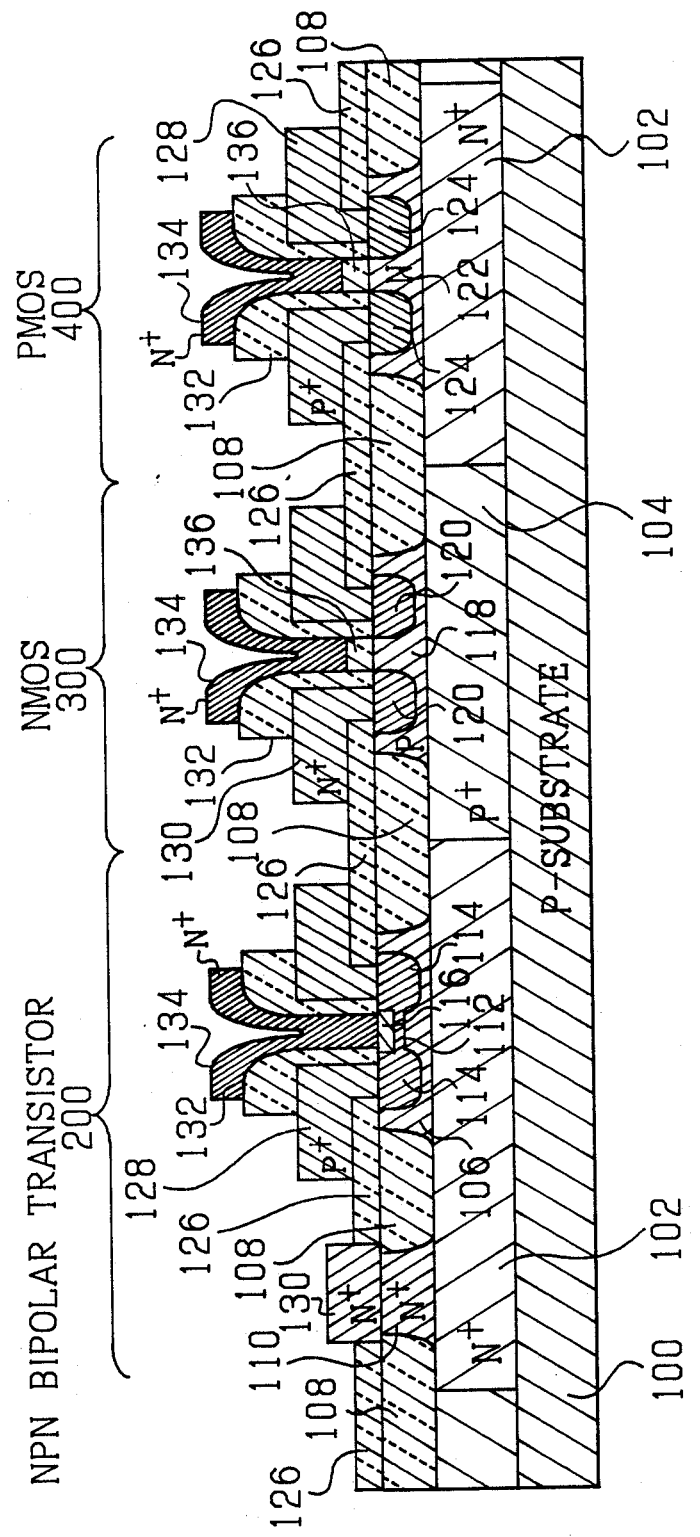
FIG. 2 is a diagrammatical sectional view of one embodiment of the Bi-CMOS device in accordance with the present invention.

Referring to FIG. 2, there is shown a diagrammatical sectional view of one embodiment of the Bi-CMOS device in accordance with the present invention. The shown Bi-CMOS device comprises a P-type semiconductor substrate 100 having N+ buried layers 102 and P+ buried layers 104 formed at predetermined positions of a principal surface of the substrate 100. On these buried layers, a single N-type epitaxial layer 106 is deposited as the same level semiconductor layer, and NPN bipolar transistors 200, NMOS transistors 300 and PMOS transistors 400 are, respectively, formed at predetermined regions of the epitaxial layer 106 which are separated from one another by a field isolation oxide layer 108. As seen from FIG. 2, the epitaxial layer 106 has a planar upper or principal surface.

In the epitaxial layer 106 for the NPN bipolar transistor 200, an N+ collector diffused layer 110 is formed to extend downwardly from a top surface of the epitaxial layer 106 and to reach the N+ buried layer 102. This N+ collector diffused layer 110 is isolated from a remaining portion of the epittaxial layer 106 for the NPN bipolar transistor 200 by the field isolation oxide layer 108. In the remaining portion of the epitaxial layer 106 for the bipolar transistor 200, a P-type base region 112 is formed and an P+ grafted base diffused layer 114 is formed adjacent to each side of the base region 112. In addition, an N+ emitter region 116 is formed at a center portion of the base region 112.

The epitaxial layer on the P+ buried layer 104 for the NMOS transistor 300 is modified to a P-type well 118, and a pair of N+ diffused regions 120 are formed in the P-type well 118 separately from each other so as to form a source region and a drain region of the NMOS transistor 300.

The epitaxial layer on the N+ buried layer 102 for the PMOS transistor 400 is also modified to a N-type well 122, and a pair of P+ diffused regions 122 are formed in the N-type well 122 separately from each other so as to form a source region and a drain region of the PMOS transistor 400.

In addition to the above mentioned arrangement, a first insulating layer 126 is formed on the principal surface of the epitaxial layer 106 to extend outwardly from a peripheral portion of the grafted base region 114 of the bipolar transistor 200 and from a peripheral portion of the source/drain regions 120 and 124 of each of the MOS transistors 300 and 400. A P+ polysilicon layer 128 is formed on and in contact with the grafted base region 114 of the bipolar transistor 200 and the P+ diffused source/drain regions 124 of the PMOS transistor 400 so as to extend on the first insulating layer 126. An N+ polysilicon layer 130 is formed on and in contact with the N+ diffused source/drain regions 120 of the NMOS transistor 300 so as to extend on the first insulating layer 126. The P+ polysilicon layer 128 and the N+ polysilicon layer 130 constitute a first polycrystalline semiconductor layer of the present invention.

Furthermore, a second insulating layer 132 is formed to cover the P+ polysilicon layer 128 and the N+ polysilicon layer 130. This second insulating layer 132 also covers a base-emitter junction (between the base region 112 and the emitter region 116) exposed at the principal surface of the epitaxial layer 106, a portion of the grafted base region 114 adjacent to the exposed base-emitter junction, and a portion of the emitter region 116 adjacent to the exposed base-emitter junction. Further, the second insulating layer 132 covers an inside edge of each of the source/drain regions 120 and 124 of the MOS transistors 300 and 400 exposed at the principal surface of the epitaxial layer 106, and portions of the source/drain regions 120 and 124 adjacent to the above mentioned inside edge of the source/drain regions 120 and 124, and portions of a channel region adjacent to the above mentioned inside edge of the source/drain regions 120 and 124. The channel region is formed between the source/drain regions of each MOS transistor. In addition, a second polycrystalline semiconductor layer 134 of an N+ polysilicon is formed to cover a gate insulator 136 of each of MOS transistors 300 and 400 and the emitter N+ diffused region 116 of the bipolar transistor in contact with the emitter N+ diffused region 116 so as to extend on the second insulating layer 132.

As shown in FIG. 2, an inside edge of a portion of the P+ polysilicon layer 128 in which with the grafted base region 114 is positioned outside of the emitter-base junction at the principal surface of the epitaxial layer, and an inside edge of a portion of the P+ polysilicon layer 128 in contact with each of the source/drain regions 124 is positioned outside of an inside edge of the source/drain regions 124 at the principal surface of the epitaxial layer. In addition, an inside edge of a portion of the N+ polysilicon layer 130 in contact with each of the source/drain regions 120 is positioned outside of an inside edge of the source/drain regions 120 at the principal surface of the epitaxial layer.

As seen from the above mention structure, the Bi-CMOS device in accordance with the present invention is characterized by the provision, on active regions of the transistors 200, 300 and 400, of the first insulating layer 126, the first polysilicon layer including the P+ polysilicon layer 128 and the N+ polysilicon layer 130, the second insulating layer 132 and the second polysilicon layer 134. In addition, all the electrodes of the bipolar and MOS transistors and all the insulating layers are formed on the planar upper or principal surface of the epitaxial layer 106, the P-type well 118 and the N-type well 122. Namely, a planar type integrated circuit can be realized. Furthermore, the second polysilicon layer 134, which acts as the emitter electrode and its lead wire or as the gate electrode and its lead wire, extend on the second insulating layer 132. Accordingly, the emitter electrode and its lead wire and as the gate electrode and its lead wire can have a sufficient width, and therefore, can have a sufficient reduced wiring resistance.

Figure 3A:
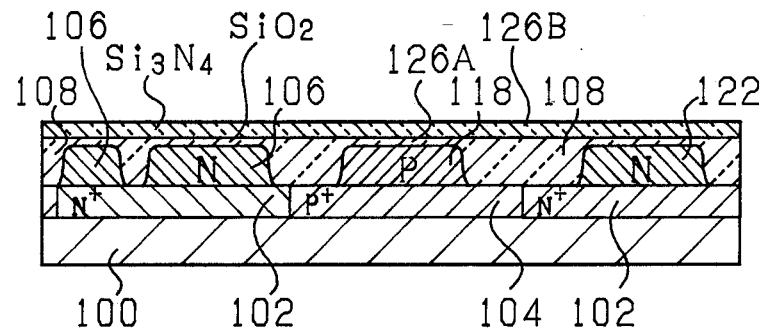
FIGS. 3A to 3S illustrate a manufacturing process for the embodiment of the Bi-CMOS device in accordance with the present invention.

Now, explanation will be made on one example of the manufacturing process for the Bi-CMOS device shown in FIG. 2 with reference to FIG. 3A to 3S which respectively illustrate sectional views of the device in main steps of the manufacturing process.

First, there is prepared a P-type silicon substrate 100. N+ buried layers 102 and P+ buried layers 104 are formed on a principal surface of the substrate 100, and a N-type epitaxial layer 106 having for example a thickness of not greater than 1.5 μm and a specific resistance of not greater than 1Ω.cm is formed on the buried layers 102 and 104. Thereafter, field oxide layers 108 are formed by a conventional isoplanar method for device isolation. In an area where the NPN bipolar transistor 200 is to be formed, the epitaxial layer 106 is left as it is. In an area where the NMOS transistor 300 is to be formed, a P-type well 118 is formed to extend from a top surface of the epitaxial layer so as to reach the N+ buried layers 104. In an area where the PMOS transistor 400 is to be formed, a N-type well 122 is formed to extend from a top surface of the epitaxial layer so as to reach the N+ buried layers 102. Thereafter, a silicon thermal oxide layer 126A having a thickness of 500 Å is formed on the principlal surface of the substrate 100, and then, a silicon nitride layer 126B having a thickness of 1500 Å is deposited on the silicon oxide layer 126A. The silicon oxide layer 126A and the silicon nitride layer 126B constitute the above mentioned first insulating layer 126. Thus, the substrate 100 as shown in FIG. 3A is prepared.

Figure 3B:
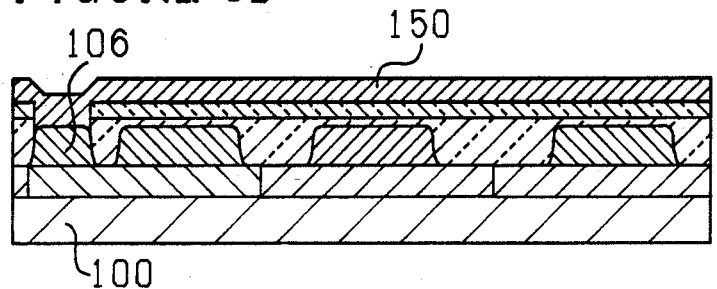

Thereafter, the silicon oxide layer 126A and the silicon nitride layer 126B at a collector portion of the NPN bipolar transistor are selectively etch-removed, and then, a polysilicon layer 150 of 5000 Å thickness is deposited on the principal surface of the substrate 100, as shown in FIG. 3B.

Figure 3C:
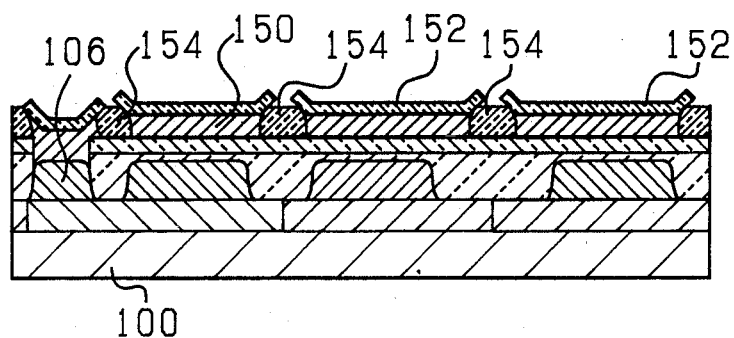

A silicon nitride layer 152 of 1200 to 1500 Å thickness is deposited on the substrate, and selectively removed from above the field oxide 108, namely from areas excluding areas where devices are to be formed. Then, the substrate is oxidized in an oxygen atmosphere under pressure (for example 2 to 3 atm.) at a temperature of 950° C. for 60 minutes so that the polysilicon layer u50 excluding the device formation areas is converted into an insulating oxide layer 154, as shown in FIG. 3C.

Figure 3D:
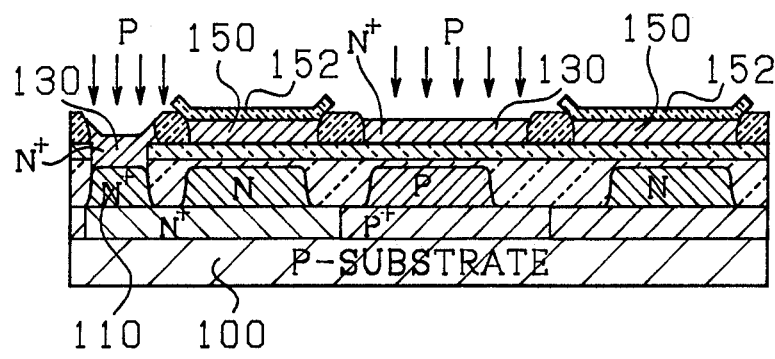

Thereafter, as shown in FIG. 3D, the silicon nitride layer 152 are selectively removed from an area where a collector electrode portion of the bipolar transistor 200 is to be formed and another area where the NMOS transistor 300 is to be formed. Then, the substrate is put in an atmosphere of POCl₃ at a temperature of 950° C. for 20 minutes so that phosphorus is doped to an exposed portion of the polysilicon layer 150. Namely, the exposed portion of the polysilicon layer 150 is converted into the N+ polysilicon layer 130 which constitute an collector electrode of the bipolar transistor 200 and a source/drain electrode of the NMOS transistor 300. At this time, since the silicon thermal oxide layer 126A under the polysilicon layer portion for the collector electrode portion was previously removed, the phosphorus doped into the N+ polysilicon layer 130 is further diffused into the epitaxial layer 106 so as to form the collector N+ diffused layer 110.

Figure 3E:
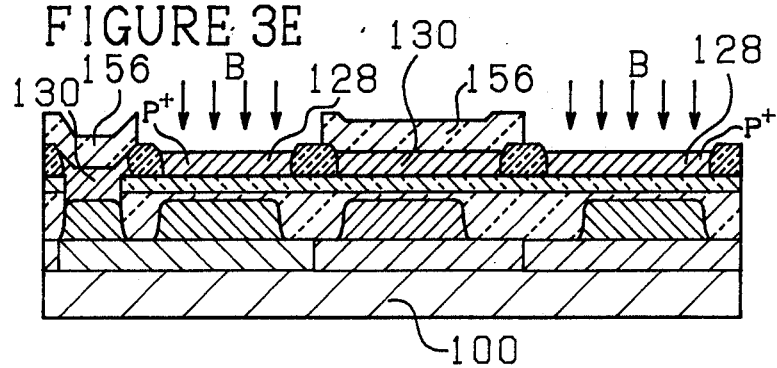

Then, as shown in FIG. 3E, the silicon nitride layer 152 on the polysiliconlayer 150 is removed, and an mask 156 is formed to cover the N+ polysilicon layer 130. Boron ions are selectively doped to an area where base and emitter regions for the bipolar transistor 300 are to be formed and an area where the PMOS transistor 400 is to be formed, by ion implantation under an acceleration voltage of 50 KeV and with a dose of $1.0 \times 10^{15}$ cm$^{-2}$. As a result, P+ polysilicon layer 128 is formed.

Thereafter, the mask 156 is removed. Further, as shown in FIG. 3F, the P+ polysilicon layer 128 is selectively removed from an area where an emitter region of the bipolar transistor 200 is to be formed and from an area where a gate of the PMOS transistor 400 is to be formed, and also, the N+ polysilicon layer 130 is selectively removed from an area where a gate of the NMOS transistor 300 is to be formed.

Figure 3F:
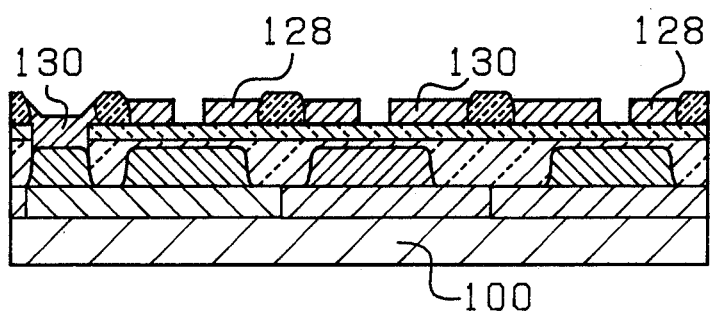
Figure 4B:
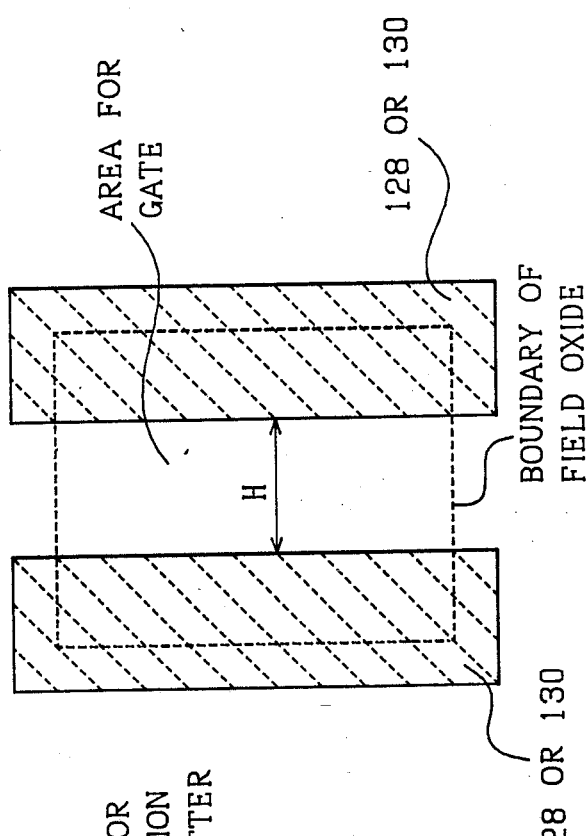
FIGS. 4A and 4B are plan views illustrating some step in the way of the manufacturing process shown in FIGS. 3A to 3S.
Figure 4A:
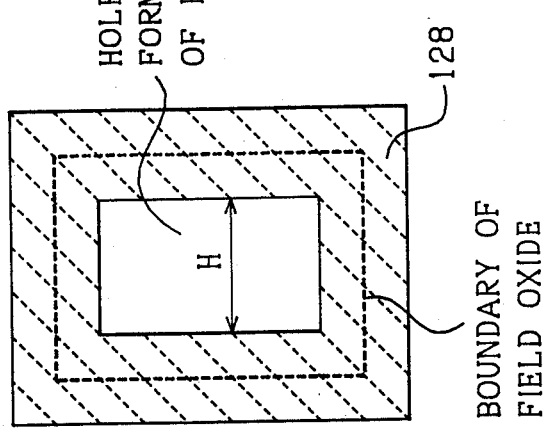

A positional relation in plan of the remaining polysilicon layers 128 and 130 and the boundary of the field oxide 108 are shown in FIGS. 4A and 4B, which are plan views illustrating the bipolar transistor portion and the MOS transistor portion of the substrate at the step shown in FIG. 3F, respectively. As seen from FIG. 4A, the remaining polysilicon layer 128 defines an emitter formation hole surrounding an area where the base and emitter of the bipolar transistor are to be formed. On the other hand, as shown in FIG. 4B, the polysilicon layer 128 and 130 are divided into two portions separated by the area for gate formation. These divided two portions of the polysilicon layer will constitute a source electrode and a drain electrode, respectively, in future. A width or distance H of the emitter formation hole and the area for gate formation can be made about 1.0 to 1.2 μm which is the limit in the current fine etching technology.

The subsequent manufacturing process is performed in accordance with a super self-aligned process technology (SST) for formation of a base electrode and an emitter electrode of the NPN bipolar transistor 200.

For simplification of the drawings and the description, the subsequent manufacturing process will be explained with reference to FIGS. 3G to 3Q which illustrate only a base electrode portion and an emitter electrode portion of the NPN bipolar transistor 200. FIGS. 3R and 3S illustrate only a portion where the MOS transistor it to be formed.

Figure 3G:
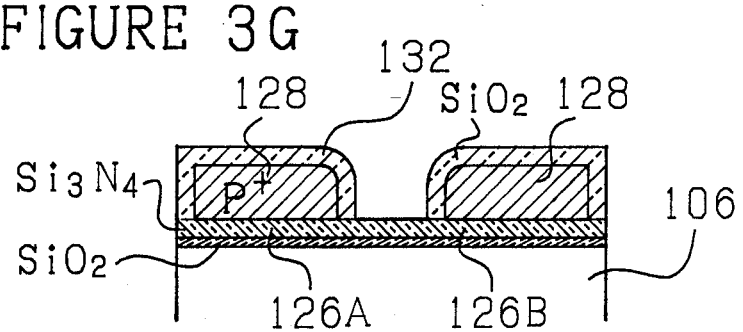

As shown in FIG.3G, the substrate 100 is oxidized under a steam atmosphere of 950° C. for 30 minutes, so that a second insulating layer 132 of SiO₂ is formed to cover a surface of the P+ polysilicon layer 128 on the epitaxial layer 106. At this time, although not shown, the second insulating layer 132 is also formed on the P+ polysilicon layer 128 which will constitute a source electrode and a drain electrode of the PMOS transistor 400 formed in the same substrate and on the N+ polysilicon layer 130 which will constitute a source electorde and a drain electrode of the NMOS transistor 300. In addition, the second insulating layer 132 formed on the N+ polysilicon layer 130 is thicker than the second insulating layer 132 formed on the P+ polysilicon layer 128 because of an enhanced oxidation of phosphorus.

Figure 3H:
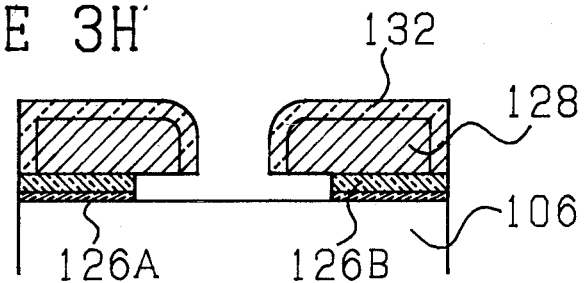

Thereafter, the silicon nitride layer 126B is over-etched by a hot phosphoric acid liquid to that an under surface of the P+ polysilicon layer 128 is partially exposed. Further, the silicon thermal oxide layer 126A is etch-removed by a buffered hydrofluoric acid liquid by using the remaining silicon nitride layer 126B as a mask so that a single crystalline silicon surface of the epitaxial layer 106 is exposed, as shown in FIG. 3H.

Figure 3I:
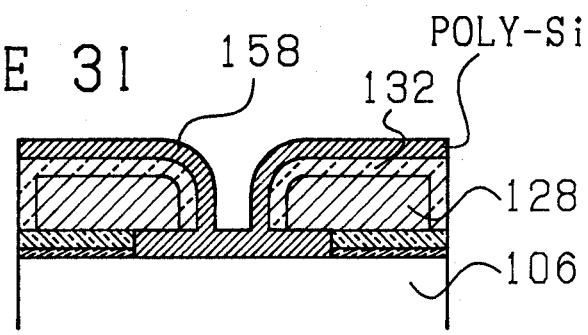

As shown in FIG. 3I, a polysilicon layer 158 is deposited with a thickness of about 2500 Å by a LPCVD method so as to fill a space from which the silicon nitride layer 126B and the silicon oxide layer 126A have been removed.

Figure 3J:
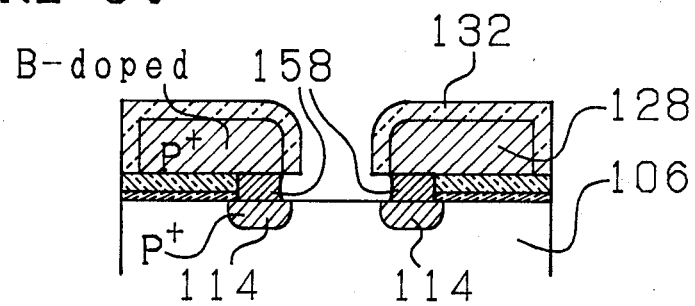

Thereafter, the substrate is etched for example by hydrazine liquid so that the polysilicon layer 158 is left only under the P+ polysilicon layer 128, and then, the substrate is put in a $N_2$ atmosphere of 900° C. for 30 minutes, so that boron is diffused from the P+ polysilicon layer 128 through the remaining polysilicon layer 158 to the N-type epitaxial layer 106 thereby to form a grafted base P+ diffused region 114, as shown in FIG. 3J.

At this time, although not shown, in the portion for PMOS transistor 400, boron is diffused from the P+ polysilicon layer 128 to the N-type well 122 so that source/drain P+ diffused regions 124 are formed. In addition, in the portion for NMOS transistor 300, phosphorus is diffused from the N+ polysilicon layer 130 to the P-type well 118 so that source/drain N+ diffused regions 120 are formed.

Figure 3K:
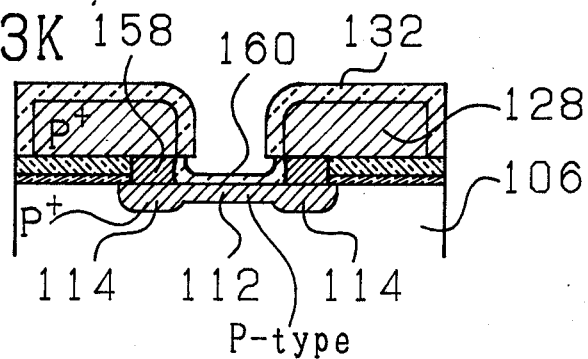

As shown in FIG. 3K, the substrate is put under a steam atmosphere of 900° C. for 10 minutes, so that an exposed silicon surface is oxidized, with the result that a silicon thermal oxide layer 160 having a thickness of 400 Å is formed which is used for formation of base. Then, boron ions are selectively doped only to an area where the bipolar transistor is to be formed, by ion implantation under an acceleration voltage of 30 KeV and with a dose of $1.0 \times 10^{13}$ cm$^{-2}$, so that a P-type base layer 112 is formed.

At this step, in the area where the NMOS transistor 300 is to be formed and in the area where the PMOS transistor 400 is to be formed, boron or phosphorus can be ion-implanted with a low dose, independently of the boron ion implantation to the base region, in order to control the threshold voltage ($V_T$) of the MOS transistors.

Figure 3L:
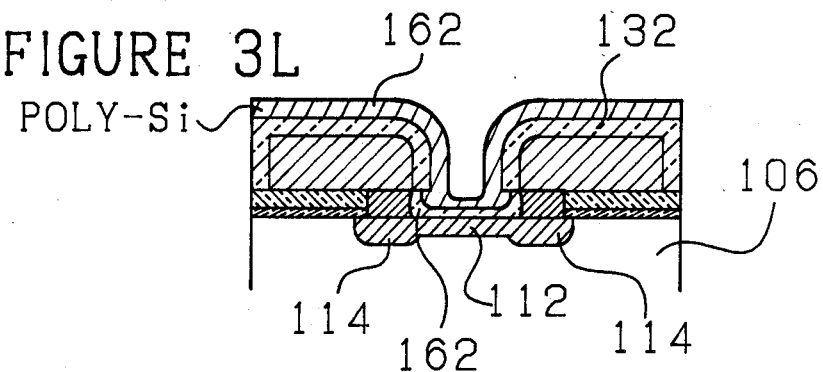

Thereafter, as shown in FIG. 3L, a polysilicon layer 162 is deposited to have a thickness of about 2000 Å. At this time, the polysilicon layer 162 is deposited on a side surface of the second insulating layer 132.

Figure 3M:
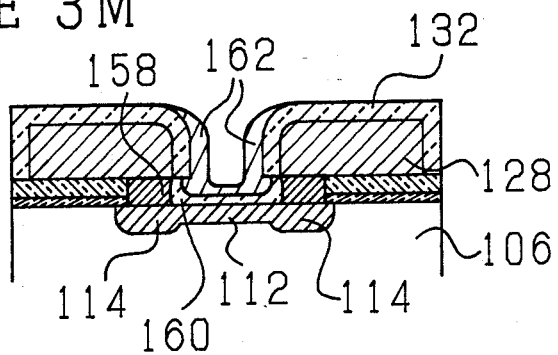

Then, as shown in FIG. 3M, the polysilicon layer 162 is subjected to an anisotropic dry etching using a $CF_4$ etching gas, so that the polysilicon layer 162 will remain at the side surface of the second insulating layer 132. The remaining polysilicon layer 162 decreases in thickness from its portion on the side surface of the second insulating layer 132 to its upper end so that the remaining polysilicon layer 162 and the second insualting layer 132 describe a smooth contour line.

Figure 3N:
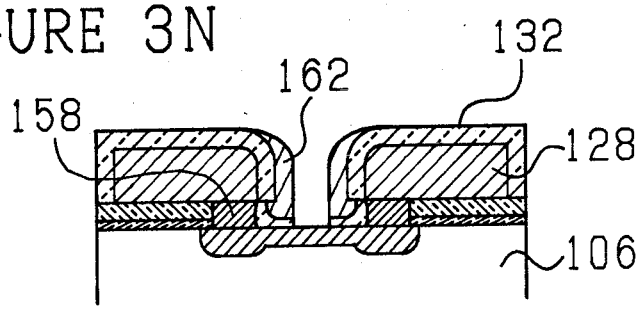
Figure 3O:
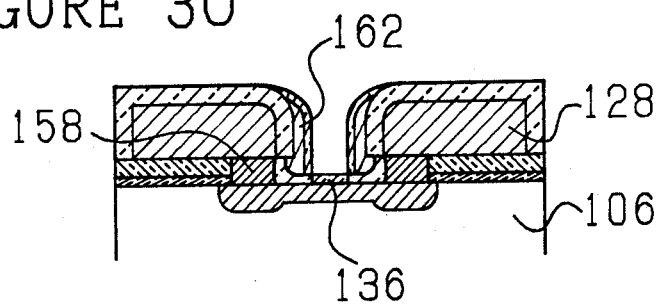

Further, as shown in FIG. 3N, the thin silicon thermal oxide layer 160 is etch-removed by a buffered hydrofluoric acid liquid so that a single crystalline silicon surface of the epitaxial layer 106, namely, the base region 112 is exposed. Then, the substrate is put in a steam atmosphere of 900° C. for 5 minutes so that a gate insulator 136 having a thickness of 250 Å is formed as shown in FIG. 3O. At this time, a silicon oxide layer is formed on a surface of the polysilicon layer 162. This gate insulator 136 is simultaneously formed not only on the exposed base portion of the NPN bipolar transistor but also on the gate portion of MOS transistors 300 and 400.

Figure 3P:
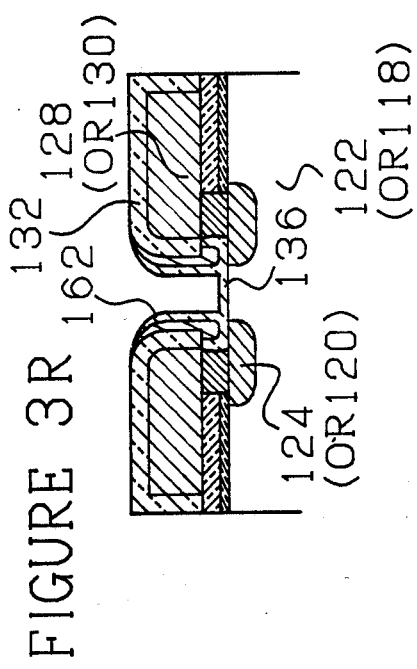

Thereafter, only the gate insulator 136 on the exposed base portion of the NPN bipolar transistor 200 selectively etch-removed by using a conventional photoresist method, so that a silicon surface of the epitaxial layer 106 is exposed, as shown in FIG. 3P. At this time, the gate insulators 136 for the MOS transistors 300 and 400 are maintained as they are, as shown in FIG. 3R.

Figure 3Q:
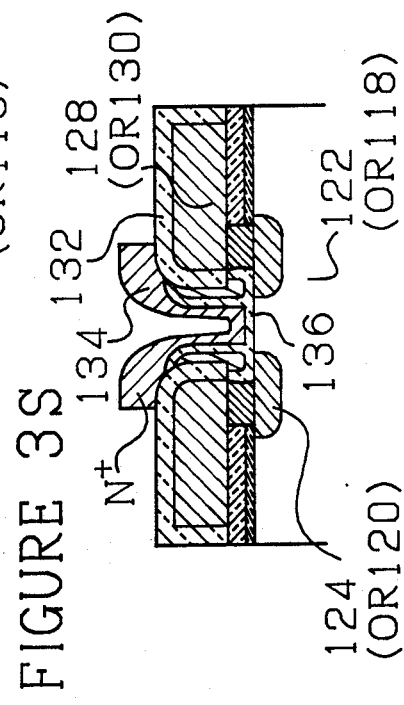
Figure 3R:
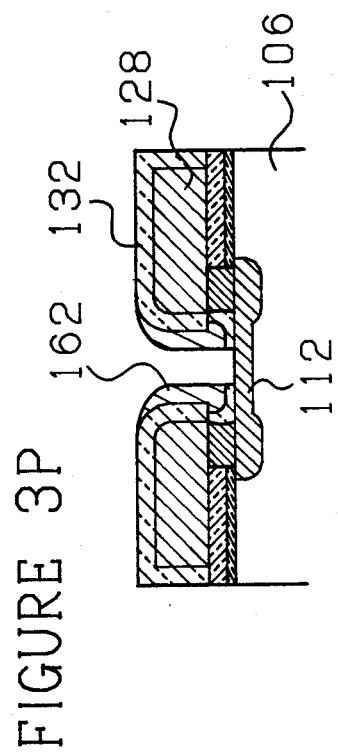

Then, as shown in FIG. 3Q, an arsenic-doped polysilicon layer of about 2500 Å thickness is deposited on the substrate and patterned to form the N+ second polysilicon layer 134. Further, the substrate is thermally processed in a $N_2$ atmosphere of about 900° C. for 10 minutes so that the arsenic contained in the N+ second polysilicon layer 134 is diffused to the epitaxial layer 106 so as to form the emitter N+ diffused region 116 in the epitaxial layer 106. Particularly, the emitter N+ diffused region 116 extends the boundary of the N+ second polysilicon layer 134, with the result that the second insulating layer 132 covers a base-emitter junction between the base region 112 and the emitter region 116 and exposed at the principal surface of the epitaxial layer 106, a portion of the grafted base region 114 adjacent to the exposed base-emitter junction, and a portion of the emitter region 116 adjacent to the exposed base-emitter junction. With this, the NPN bipolar transistor is formed.

Figure 3S:
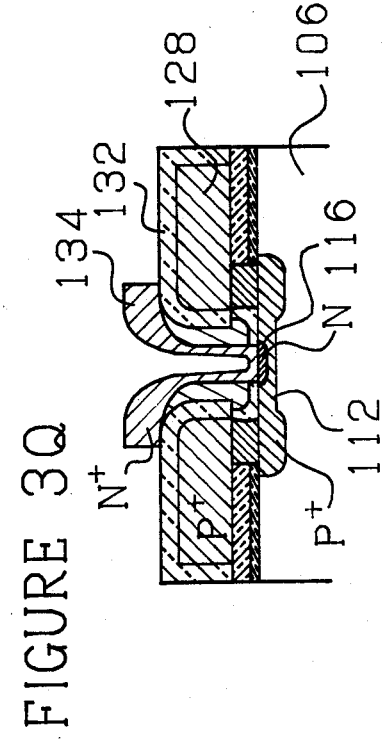

On the other hand, in the portion for the MOS transistors 300 and 400, since the gate insulator 136 is left under the N+ second polysilicon layer 134, the arsenic is prevented from diffusing to the substrate, as shown in FIG. 3S. Therefore, the NMOS transistor 300 and the PMOS transistor 400 have been completed.

Thereafter, an aluminum wiring process is performed so that the Bi-CMOS device has been completed.

In the above mentioned embodiment, the thickness of various layers and the various dose amounts are simply examples, respectively. Therefore, it should be understood that the present invention is not limited to the above mentioned values.

As seen from the above mentioned embodiment, in the NPN bipolar transistor, the P+ polysilicon layer 128 for the base electrode, the second insulating layer 132 and the N+ polysilicon layer 134 for the emitter electrode are formed in a self-aligned maner. In the NMOS transistor 300, the N+ polysilicon layer 130 for the source/drain electrodes, the second insulating layer 132 and the N+ polysilicon layer 134 for the gate electrode are formed in a self-aligned manner. In the PMOS transistor 400, the P+ polysilicon layer 128 for the source/drain electrodes, the second insulating layer 132 and the N+ polysilicon layer 134 for the gate electrode are formed in a self-aligned manner.

In the above mentioned embodiment, the NPN transistor has been formed as a bipolar transistor provided in the Bi-CMOS device. However, the present invention can be equally applied to the Bi-CMOS transistor having a PNP transistor as the bipolar transistor.

As mentioned above, the active regions of the respective transistors included in the Bi-CMOS device in accordance with the present inventio have been formed by a side etching which is easy to control a fine working and the degree of working, without using a photolithography requiring a mask which is difficult to preform a fine working or patterning. Therefore, the Bi-CMOS device in accordance with the present invention is such that main portions of each of the bipolar transistor and the NMOS and PMOS transistors are formed in a self-aligned manner. As a result, the emitter width of the bipolar transistor can be reduced to a value of 0.5 μm or less. In addition, the distance between the emitter diffused region and the grafted base region for the base electrode can be reduced to a value of 0.3 μm or less. In the NMOS and PMOS transistors, further, the gate length can be reduced to a value of 0.5 μm or less. Therefore, there can be realized a Bi-CMOS device composed of high speed bipolar transistors and submicron CMOS transistors. Such a Bi-CMOS device can have a high operation speed and a high integration density.

The invention has thus been shown and described with reference to the specific embodiments. However, it should be noted that the present invention is in no way limited to the details of the illustrated structures but changes and modifications may be made within the scope of the appended claims.

I claim:

1. A process for manufacturing a semiconductor device which includes at least one bipolar transistor, one N-channel MOS transistor and one P-channel transistor which are formed in the same semiconductor substrate at the same semiconductor layer level, comprising:

preparing a substrate including a bipolar transistor section including a collector region formed in said semiconductor substrate, and a first conduction type well for a first type MOS transistor and a second conduction type well for a second type MOS transistor, the bipolar transistor section, the first conduction type well and the second conduction type well being isolated from each other and covered by a first insulating layer formed on the principal surface of the semiconductor substrate;

selectively etching said first insulating layer to expose a portion of said bipolar transistor section and forming a first polycrystalline semiconductor layer on said first insulating layer and said exposed portion of said bipolar transistor section;

selectively doping a first impurity to a portion of said first polycrystalline semiconductor layer on said exposed portion of said bipolar transistor section and on said first conduction type well, respectively, and also selectively doping to a second impurity of a conduction type opposite to that of said first impurity, to another portion of said first polycrystalline semiconductor layer on said second conduction type well and on another portion of said bipolar transistor section, respectively;

selectively removing a portion of said first polycrystalline semiconductor layer on said first conduction type well, said second conduction type well and on said another portion of said bipolar transistor section so as to partially expose said first insulating layer;

forming a second insulating layer on said first polycrystalline semiconductor layer and a portion of said first insulating layer respectively exposed in said first conduction type well, said second conduction type well and said bipolar transistor section;

over-etching said exposed portion of said first insulating layer by using said second insulating layer as a mask so that said first insulating layer under said first polycrystalline semiconductor layer is partially removed;

filling a polycrystalline semiconductor to a space formed under said first polycrystalline semiconductor layer as the result of said over-etching and then selectively removing said filled polycrystalline semiconductor so as to leave said filled polycrystalline semiconductor under said first polycrystalline semiconductor layer;

heating said substrate so that the impurities included in said first polycrystalline semiconductor layer are respectively diffused to said first conduction type well, said second conduction type well and said bipolar transistor section;

selectively doping impurity to only a portion of said bipolar transistor section which is not covered by said first polycrystalline semiconductor layer so that a base region is formed;

forming an oxide layer on said first conduction type well, said second conduction type well and said bipolar transistor section which are not covered by said first polycrystalline semiconductor layer so that said oxide layer formed on said first conduction type well and said second conduction type well forms a gate insulator;

selectively removing only said oxide layer on said bipolar transistor section which is not covered by said first polycrystalline semiconductor layer so that an area within said base region where an emitter region is to be formed is exposed;

depositing a second polycrystalline semiconductor layer including a predetermined conduction type of impurity, on said second insulating layer, said gate insualtor on each of said first conduction type well and said second conduction type well, and said emitter formation area in said bipolar transistor section; and heating said substrate to cause said predetermined conduction type of impurity contained in said second polycrystalline semiconductor layer to be diffused to said emitter formation area in said bipolar transistor section so that an emitter region is formed in said bipolar transistor section.

2. A process claimed in claim 1 wherein said oxide layer formation is performed by thermally oxidizing said substrate.

* * * * *